(12) United States Patent
Keil et al.

(10) Patent No.: US 7,347,915 B1
(45) Date of Patent: Mar. 25, 2008

(54) PLASMA IN-SITU TREATMENT OF CHEMICALLY AMPLIFIED RESIST

(75) Inventors: Douglas L. Keil, Fremont, CA (US); Wan-Lin Chen, Sunnyvale, CA (US); Eric A. Hudson, Berkeley, CA (US); S. M. Reza Sadjadi, Saratoga, CA (US); Mark H. Wilcoxson, Piedmont, CA (US); Andrew D. Bailey, III, Pleasanton, CA (US)

(73) Assignee: LAM Research Corporation, Fremont, CA (US)

( * ) Notice: Subject to any disclaimer, the term of this patent is extended or adjusted under 35 U.S.C. 154(b) by 0 days.

(21) Appl. No.: 11/326,934

(22) Filed: Jan. 5, 2006

Related U.S. Application Data

(62) Division of application No. 10/426,043, filed on Apr. 28, 2003, now Pat. No. 7,022,611.

(51) Int. Cl.
   H01L 21/00 (2006.01)
(52) U.S. Cl. ............................ 156/345.47; 156/345.43
(58) Field of Classification Search ........... 156/345.43, 156/345.44, 345.45, 345.46, 345.47; 118/723 E
   See application file for complete search history.

(56) References Cited

U.S. PATENT DOCUMENTS

| | | | |
|---|---|---|---|
| 4,539,068 A * | 9/1985 | Takagi et al. ............... | 427/570 |
| 4,810,935 A | 3/1989 | Boswell | |
| 4,990,229 A | 2/1991 | Campbell et al. | |
| 5,091,049 A | 2/1992 | Campbell et al. | |
| 5,122,251 A | 6/1992 | Campbell et al. | |
| 5,188,980 A * | 2/1993 | Lai ............... | 438/9 |
| 5,300,460 A * | 4/1994 | Collins et al. .............. | 438/712 |
| 5,421,891 A | 6/1995 | Campbell et al. | |
| 5,549,780 A * | 8/1996 | Koinuma et al. ...... | 156/345.39 |
| 5,685,949 A * | 11/1997 | Yashima ...................... | 438/694 |
| 5,976,395 A * | 11/1999 | Ha ............... | 216/67 |
| 6,004,631 A * | 12/1999 | Mori .......................... | 427/534 |
| 6,024,044 A * | 2/2000 | Law et al. ............... | 118/723 E |
| 6,048,435 A * | 4/2000 | DeOrnellas et al. ... | 156/345.44 |
| 6,326,307 B1 | 12/2001 | Lindley et al. | |

(Continued)

FOREIGN PATENT DOCUMENTS

EP         969123 A1 *    1/2000

OTHER PUBLICATIONS

Tynan et al., "Characterization of an Azimuthally Symmetric Helicon Wave High Density Plasma Source", J. Va. Sci. Technol. A 15(6), Nov./Dec. 1997, pp. 2885-2892.

(Continued)

*Primary Examiner*—Parviz Hassanzadeh
*Assistant Examiner*—Michelle Crowell
(74) *Attorney, Agent, or Firm*—Beyer Weaver LLP

(57) ABSTRACT

A method for creating semiconductor devices by etching a layer over a wafer is provided. A photoresist layer is provided on a wafer. The photoresist layer is patterned. The wafer is placed in a process chamber. The photoresist is hardened by providing a hardening plasma containing high energy electrons in the process chamber to harden the photoresist layer, wherein the high energy electrons have a density. The layer is etched within the process chamber with an etching plasma, where a density of high energy electrons in the etching plasma is less than the density of high energy electrons in the hardening plasma.

9 Claims, 8 Drawing Sheets

U.S. PATENT DOCUMENTS

| | | | |
|---|---|---|---|
| 6,341,574 | B1 | 1/2002 | Bailey, III et al. |
| 6,358,670 | B1 | 3/2002 | Wong et al. |
| 6,458,430 | B1 | 10/2002 | Bernstein et al. |
| 6,706,138 | B2 * | 3/2004 | Barnes et al. ............ 156/345.1 |
| 6,815,359 | B2 | 11/2004 | Gabriel et al. |
| 2002/0039704 | A1 | 4/2002 | Din et al. |
| 2003/0222345 | A1 | 12/2003 | Kenyon et al. |

OTHER PUBLICATIONS

Lieberman et al., "Principles of Plasma Discharges and Materials Processing", A Wiley-Interscience Publication, John Wiley & Sons, Inc., pp. 20 and 414, year unknown.

Trikon Technologies, Omega® 201, 8 pages, year unknown.

Electron Vision Corporation, ElectronCure™ 4000 Process Module, 2 pages, year unknown.

Electron Vision Corporation, ElectronCure™ 1200 Atmospheric Cluster Tool, 2 pages, year unknown.

Martens et al., "Modification of 193nm(ArF) Photoresists by Electron Beam Stabilization", Advances in Resist Technology and Processing XVIII, Proceedings of SPIE vol. 4345 (2001), pp. 138-149.

W. R. Livesay, "Large-Area Electron-Beam Source", J. Vac. Sci. Technol. B 11(6), Nov./Dec. 1993, pp. 2304-2308.

Murtaza et al., "A Shallow-Trench Isolation Study for 0.18 μm CMOS Technology with Emphasis on the Effects of Well Design, Channel-Stop Implants, Trench Depth and Salicide Process", 1997 Symposium on VLSI Technologies, pp. 133-137.

Kudo et al., "CD Changes of 193 nm Resists during SEM Measurement", Advances in Resist Technology and Processing XVIII (2001), Proceedings DPIE vol. 4345, pp. 179-189, year unknown.

Rossnagel et al., Handbook of Plasma Processing, 1990, Noyes Publications, p. 198.

* cited by examiner

PLASMA IN-SITU TREATMENT OF CHEMICALLY AMPLIFIED RESIST

RELATED APPLICATIONS

This is a Divisional application of prior U.S. application Ser. No. 10/426,043, entitled "PLASMA IN-SITU TREATMENT OF CHEMICALLY AMPLIFIED RESIST", filed on Apr. 28, 2003 now U.S. Pat. No. 7,022,611, which is incorporated herein by reference and from which priority under 35 U.S.C. § 120 is claimed.

BACKGROUND OF THE INVENTION

The present invention relates to photoresist patterning. More particularly, the present invention relates to strengthening a photoresist pattern against damage.

Photolithography for patterning photoresist is widely used in the production of semiconductor devices. Presently, 248 nm lithography, using a Krypton Fluoride (KrF) light source, and higher wavelength lithography are very common. It is desirable to perform photolithography with light of a wavelength less than 248 nm to allow a reduction in the design rules used to create smaller semiconductor devices. 193 nm lithography using an Argon Fluoride (ArF) light source may be used commercially obtain 0.1 µm to 0.07 µm sizes. Also, 157 nm lithography using a Fluorine ($F_2$) light source may also be used in the future.

Chemically amplified positive resists are a type of photoresist that may be used. Amplified positive resists may comprise a polymer with a functional group combined with a separate photoacid generator molecule. Upon exposure to a certain light, the photoacid generator may create a weak acid, which diffuses through the polymer material. After the exposure, photoresist material may be baked, which may cause the acid to attack certain cleavable groups, which deprotects those groups and leaves a carboxylic acid in their place. The photoresist layer may then be developed by a solvent in a wet bath, which binds to the carboxylic acid, which makes polymers with carboxylic acid groups soluble in the solvent while polymers without the carboxylic acid groups are insoluble in the solvent.

For photoresist materials used for 248 nm and higher wavelength lithography, cross-linking of the photoresist polymer material is typically induced by exposure to deep UV radiation. This method of cross-linking may not be effective for photoresist material used for 193 nm and lower wavelength lithography, such as 157 nm and 45 nm, because these materials are designed to only weakly absorb deep UV radiation. Generally, 193 nm and lower wavelength lithography photoresist material will require the absence of double-bonded carbon and aromatic carbon groups in the polymer. These functional groups have traditionally been used as sites which can be activated to induce cross-linking in photoresist, in some cases by exposure to deep UV radiation, to improve etch and ion implantation resistance. It is believed the absence of these functional groups in 193 nm and lower wavelength photoresist materials, reduces the possibilities for cross-linking these polymers, for example when exposed to deep UV radiation.

Current chemically amplified photoresist material developed for use with 193 nm and lower wavelength lithography is adversely affected by plasma etching or ion implantation. Exposure of a 193 nm or lower wavelength photoresist film to an etch plasma may lead to a roughening of the film surface and a resulting degradation of the pattern quality. Striations in the walls of trenches and vias, an increase or decrease in critical dimensions, distortion of feature shapes, and pinhole etching of dielectric beneath photoresist film may be some of the undesirable outcomes of this degradation. The release of functional groups during plasma processing may occur from the bulk of the photoresist layer, which may significantly modify the plasma and may affect the etch chemistry. The release of these functional groups may also cause some of the above-described roughening of the film. Photoresists designed for 193 nm and lower wavelength lithography may also be etched at higher rates, compared to established photoresist materials.

The 193 nm and lower wavelength lithography photoresist film may also be degraded during the ion implantation process, due to direct interaction of ions or heating of the photoresist film. Typical high-throughput conditions for ion implantation result in significant wafer heating, which may cause thermally induced reticulation or roughening of the photoresist film and degradation of the photoresist pattern quality. Degradation of the photoresist pattern quality during implantation can lead to several undesirable outcomes, including poor CD (critical dimension) control of the implanted region, reduction in the absolute dosage, and modification of the ion depth profile.

To obtain desired critical dimensions, such resist thicknesses may be kept in the range of 0.3 to 0.5 microns. The use of such thicknesses may require improved etch selectivity over what current technology commonly provides.

In view of the foregoing, it is desirable to provide a photoresist film for 193 nm and lower wavelength lithography that is more resistant to damage caused by plasma etching and ion implantation, is less susceptible to shrinkage, and is etched at a reduced rate to provide improved etch selectivity.

SUMMARY OF THE INVENTION

To achieve the foregoing and in accordance with the purpose of the present invention a method for creating semiconductor devices by etching a layer over a wafer is provided. A photoresist layer is provided on a wafer. The photoresist layer is patterned. The wafer is placed in a process chamber. The photoresist is hardened by providing a hardening plasma containing high energy electrons in the process chamber to harden the photoresist layer, wherein the high energy electrons have a density. The layer is etched within the process chamber with an etching plasma, where a density of high energy electrons in the etching plasma is less than the density of high energy electrons in the hardening plasma.

In another embodiment of the invention, an apparatus for hardening a photoresist layer over a wafer is provided. A process chamber is provided. A wafer support, for supporting the wafer in the process chamber and grounding the wafer is provided. An electrode is spaced opposite the wafer. A first frequency RF power source is connected so as to power the electrode. A hardening gas source is provided.

In another embodiment of the invention, an apparatus for creating semiconductor devices is provided. A process chamber is provided. A hardening gas source is provided. An etching gas source is provided. A controller is controllably connected to the hardening has source and the etching gas source, comprising computer readable media, comprising computer instructions for hardening the photoresist by providing a hardening plasma containing high energy electrons in the process chamber to harden the photoresist layer, wherein the high energy electrons have a density; and computer instructions for etching the wafer within the process chamber with an etching plasma, where a density of high energy electrons in the etching plasma is less than the density of high energy electrons in the hardening plasma.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
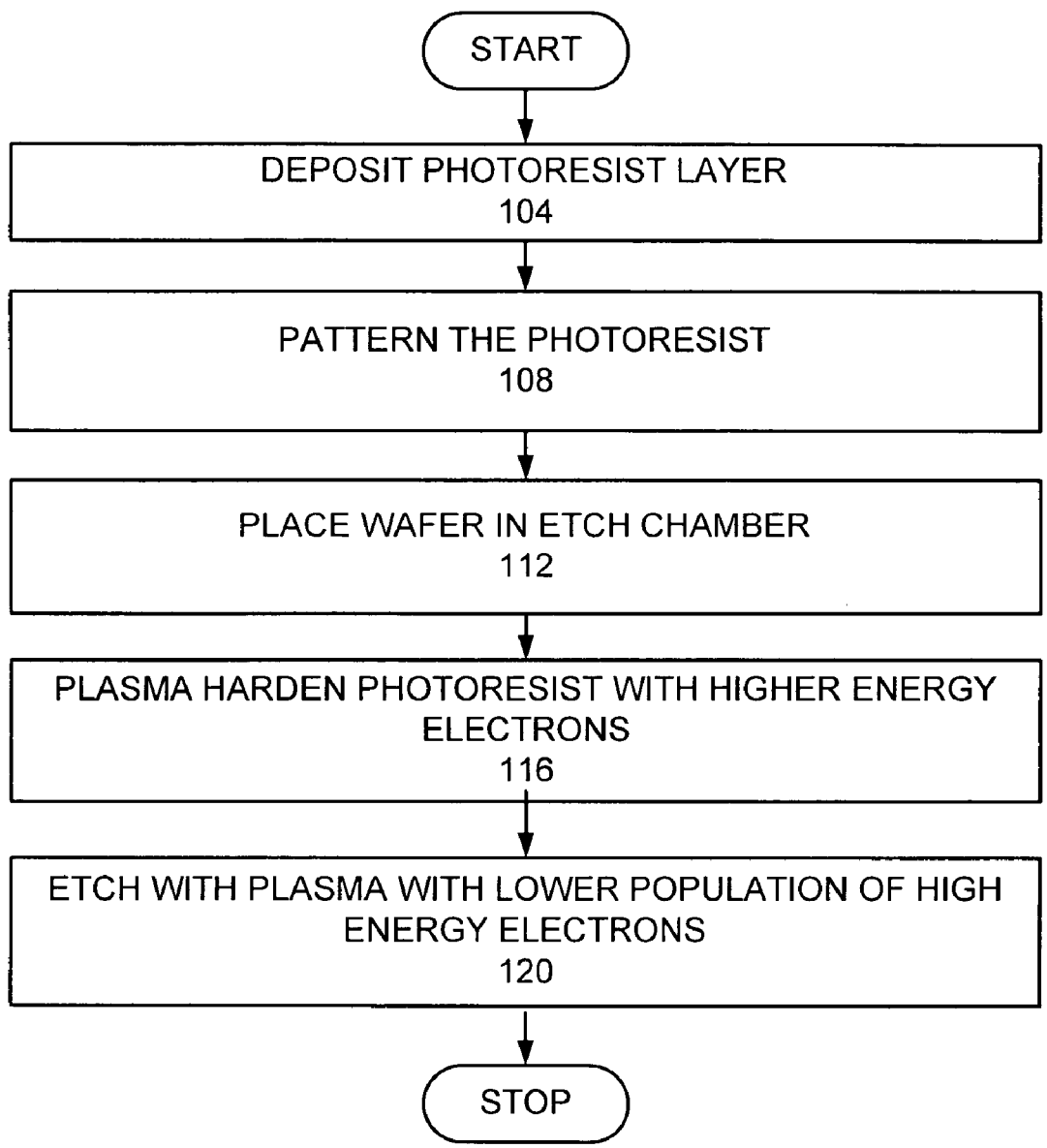
FIG. 1 is a flow chart of an inventive process.
Figure 2A:
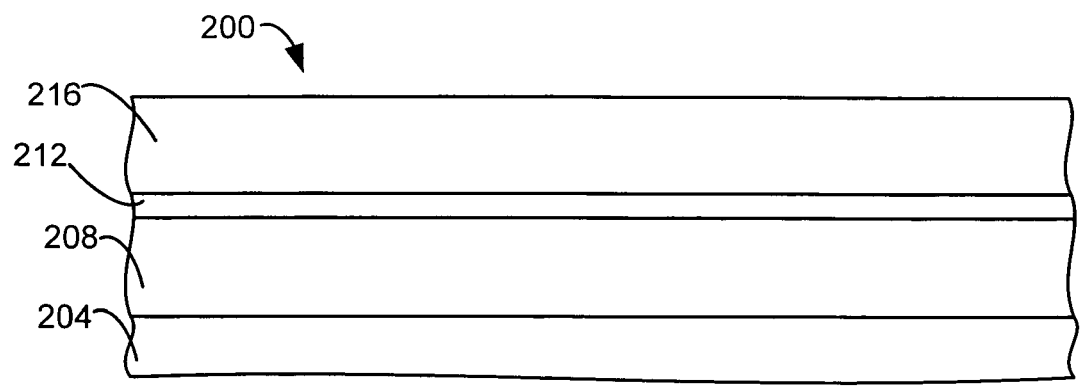
FIGS. 2 A-C are cross-sectional views of stacks being etched by the inventive process
Figure 2B:
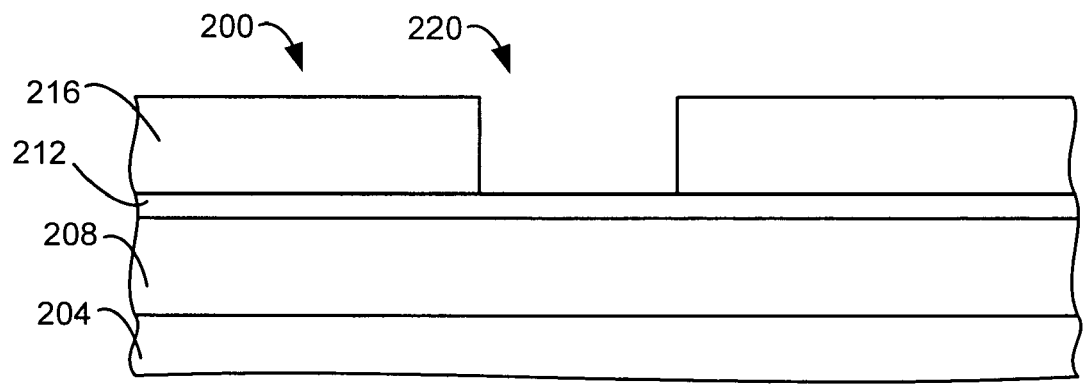

To facilitate understanding, FIG. 1 is a flow chart of a process used in an embodiment of the invention. A photoresist layer is deposited on a wafer (step 104). FIG. 2A is a cross-sectional view of a stack 200 that may be processed by the invention. The stack 200 may comprise a wafer 204 on which one or more layers 208 may be placed. The wafer is a substrate which may have additional layers used in the manufacture of semiconductor devices, such as integrated circuits and flat panel displays. An antireflective coating 212, may be placed over the one or more layers 208. A photoresist layer 216 may be placed over the antireflective coating 212. Preferably, the photoresist layer 216 is of a photoresist material designed for use with light of a wavelength less than 248 nm, such as 193 nm or 157 nm. The copolymer of 2-methyl-2-adamantyl-methacrylate with mevalonic lactone methacrylate (poly(MAdMA-co-MLMA)), is an example of a class of photoresist materials based upon derivatives of poly(methyl methacrylate) PMMA which may be used as chemically amplified 193 nm positive resist when combined with an appropriate photoacid generator. This photoresist is disclosed in: "CD Changes Of 193 nm Resists During SEM Measurement" Takanori Kudo, Jun-Bom Bae, Ralph R. Dammel, Woo-Kyu Kim, Douglas McKenzie, M. Dalil Rahuman, Munirathna Padmanaban, and Waiman Ng in Advances in Resist Technology and Processing XVIII, Proceedings SPIE Vol. 4345, pp179-189 (2001). The photoresist layer is then patterned (step 108) using photolithography. Photolithography uses the steps of exposing the photoresist layer to a light, which for this embodiment has a wavelength of 193 nm, which may be produced by an Argon Fluoride (ArF) light source, such as a laser or flashlamp, where a light pattern creates regions that are exposed to the light and regions that are not exposed to the light. The photoresist film is baked to promote the deprotection reaction, and then developed. Since in this example the photoresist film is poly(MAdMA-co-MLMA), the regions exposed by the light are removed during developing. Such developing may use a solvent wet bath to remove the photoresist in the areas exposed by the light. FIG. 2B is a cross-sectional view of the wafer 204 after the photoresist layer 216 has been patterned to form a photoresist mask. In this example, an aperture 220 has been formed in the photoresist layer 216.

Figure 2C:
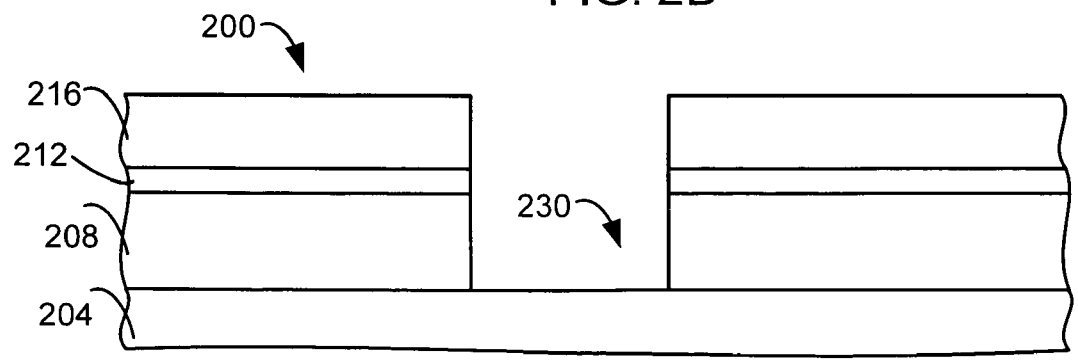
Figure 4:
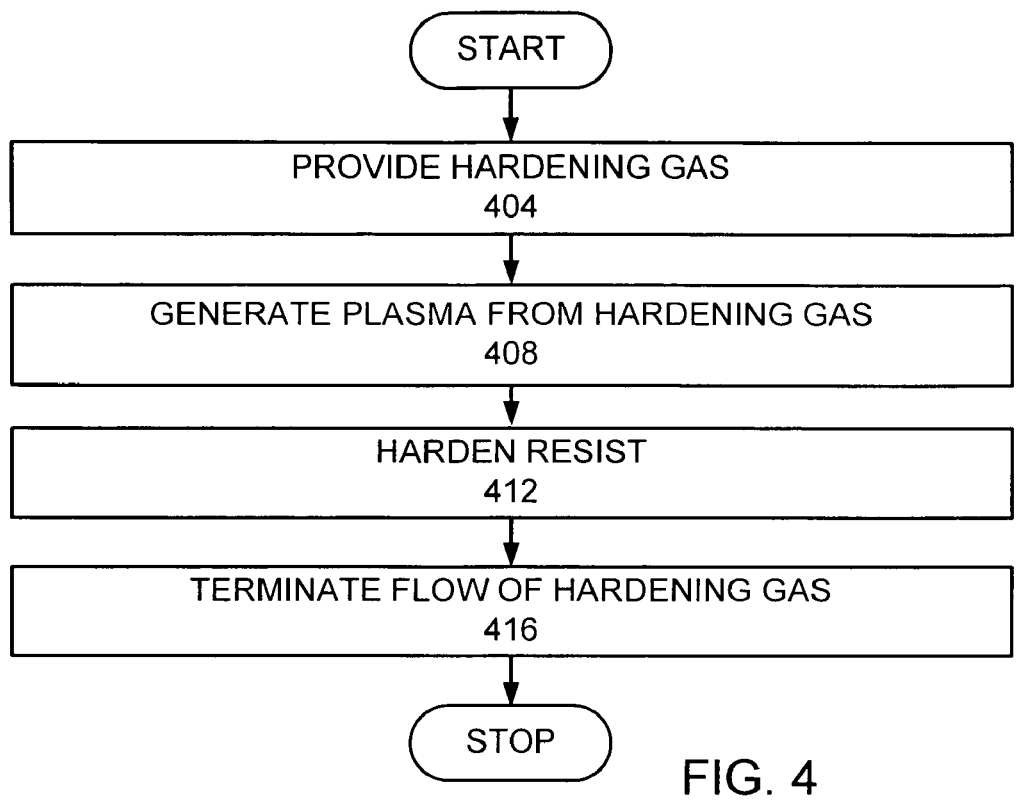
FIG. 4 is a flow chart of a preferred embodiment of the plasma hardening step.
Figure 5:
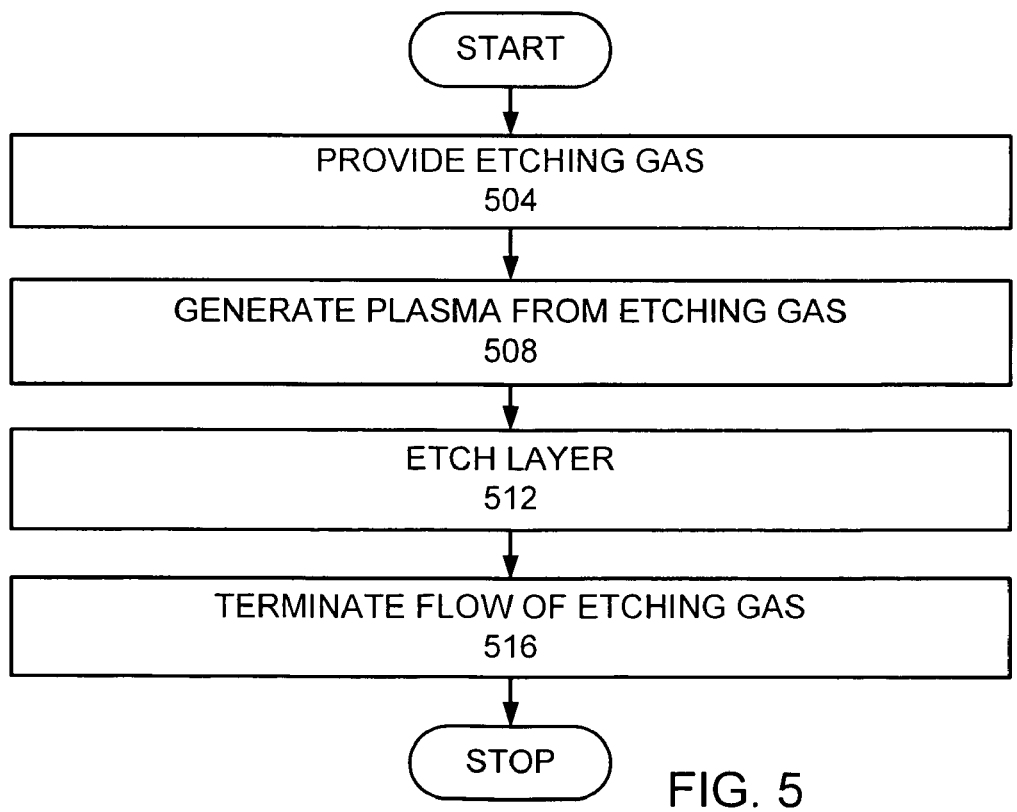
FIG. 5 is a flow chart of a preferred embodiment of the etching step.

The wafer may then be placed in an etch chamber (step 112). The resulting patterned photoresist is then subjected to a plasma hardening (step 116). FIG. 4 is a flow chart of a preferred embodiment of the plasma hardening step. A hardening gas is provided to the process chamber (step 404). Preferably, the hardening gas is able to provide a non-etching plasma with a sufficiently high population and density of high energy electrons to provide plasma hardening within a reasonable time period. A plasma is generated from the hardening gas (step 408). This results in a hardening of the photoresist layer (step 412). The flow of the hardening gas is terminated (step 416), which terminates the hardening step. In the preferred embodiment, the hardening plasma provides a population and density of high energy electrons with energies above 400 eV and with a density sufficient to provide a charge dose of about 1,000 mC/cm over a commercially practical length of time, such as perhaps 1 to 2 minutes. More preferably the high energy electrons have energies above 450 eV. Most preferably, the high energy electrons have energies between about 500-4,000 eV. Preferably, the density of the high energy electrons is greater than $10^8$ electrons/cm$^3$. More preferably, the density of the high energy electrons is greater than $10^9$ electrons/cm$^3$. Most preferably, the density of the high energy electrons is greater than $10^{10}$ electrons/cm$^3$. The hardening step hardens the photoresist to make the photoresist more resistant to etching to improve etch selectivity. An etch is then performed to etch away at least part of the layer 208 using an etch plasma with a lower population and density of high energy electrons than the hardening plasma (step 120). A lower population and density of high energy electrons is desired for the etching, since high energy electrons may cause damage to devices exposed during the etching. FIG. 5 is a flow chart of a preferred embodiment of the etching step. An etching gas is provided to the process chamber (step 504). A plasma is generated from the etching gas (step 508). The etching gas performs the etching of the layer (step 512). The flow of the etching gas is terminated (step 516) to stop the etch. FIG. 2C is a cross sectional view of the layer 208 on the wafer 204, after a 230 trenched has been etched in the layer 208. In the preferred embodiment, the etching plasma has a population and density of electrons with voltages above 500 volts sufficient to provide a charge doses of less than 900 mC/cm$^2$. When the definition of high energy electrons for the etching uses the same criteria for defining high energy electrons for the hardening, in a preferred embodiment the density of high energy electrons during the plasma etching is less than $10^8$ electrons/cm$^3$. More preferably, the density of high energy electrons during the plasma etching is less than $10^7$ electrons/cm$^3$. Most preferably, the density of high energy electrons during the plasma etching is less than $10^6$ electrons/cm$^3$.

To obtain a hardening plasma with a high population of high energy electrons, one of two preferred embodiments may be used. The two preferred embodiments are as follows:

High Density Source Embodiment

In this embodiment a "high density" plasma is used for hardening the resist. Such plasmas typically operate with electron densities of about $10^{12}$ electrons/cm$^3$. Inductive coupling of the RF (radio frequency) to the plasma is a common method for producing such plasmas. However, helicon, microwave and other discharges are also well known to be able to achieve this regime. The Electron Energy Distribution function for this system is given by Equation 1.

$$EEDF(E, T_e, N_e) = \left(\frac{2 N_e T_e^{-3/2}}{\sqrt{\pi}} \sqrt{E}\right) \exp\left(-\frac{E}{T_e}\right) \quad \text{Equation 1}$$

For a RF driven plasma, it is well known that there is a brief moment during a RF cycle during which the sheath collapses and electrons are transferred. This interval could be as much as ¼ of an RF period. It is assumed that only those electrons above 500 volts contribute to curing the resist. One can then write an expression for the current density of electrons above 500 volts delivered by a high-density tool as Equation 2:

$$J_e(T_e, N_e) = e\overline{V_e} N_e \frac{\int_{500}^{\infty} EEDF(E, T_e, N_e)\,dE}{\int_0^{\infty} EEDF(E, T_e, N_e)\,dE} \quad \text{Equation 2}$$

Where e is the charge of an electron, $T_e$ is the electron temperature and $V_e$ is the average electron thermal velocity. For the sake of simplicity, we approximate the average electron thermal velocity with the electron thermal velocity at 500 eV. The length of time (in seconds) needed to deliver a charge dose of 1000 µC/cm$^2$ can be calculated by use of Equation 3:

$$DoseTime = \frac{0.001}{J_e(T_e, N_e)} \quad \text{Equation 3}$$

In the case of a 4 eV plasma operating at a density of $10^{12}$ electrons/cm$^3$, the current density delivered is estimated to be $2.2\times10^{-10}$ Amperes/cm$^2$. In this case, 54 days of exposure time would be needed to deliver a charge dose of 1000 µC/cm$^2$. This is clearly not practical. However, a population of electrons with a temperature of 30 eV and density of $3\times10^{11}$ electrons/cm$^3$ would give $1.7\times10^{-5}$ Amperes/cm$^2$, thus requiring only about 60 seconds of exposure time to deliver a charge dose of 1000 µC/cm$^2$. This can also be achieved using a sub-population of a 4 eV plasma operating at density of $10^{12}$ electrons/cm$^3$. These sub-populations are often referred to as "hot electron tail" or "hot electron" populations in the electron energy distribution. In the preferred embodiment, a hot electron tail is a sub population of a population of electrons that exhibit an electron temperature significantly above the temperature of the bulk of the electrons. In practice this hot electron population will have temperatures greater than 10 eV but comprise less than 1% of the total electron population. Since such energies represent the extreme high end, or tail, of the electron energy distribution function it is common to refer to them as hot tail electrons and the distribution is said to have a "hot electron tail". In a more preferred embodiment of the invention the hot electron tail is defined by an electron tail population of 1% of the electrons having an energy greater than 15 eV. In a most preferred embodiment of the invention the hot electron tail is defined by an electron tail of 1% of the electrons having an energy greater than 30 eV. For all of the above percentages, a plasma density of at least $10^{12}$ electrons/cm$^3$ is assumed. Without wishing to be bound by theory, it is believed that subjecting the photoresist to a plasma with a hot electron tail causes the photoresist to be cross linked or chemically modified to provide a hardened resist.

The existence of hot electron populations in ICP, Helicon, Microwave or other high-density plasma sources are well known. Of these sources, Microwave sources are particularly likely to exhibit hot electron populations.

Preferably, the chamber volume is minimized as much as possible, since electron temperature generally rises as process chamber volume shrinks. Preferably low pressures are used. The pressure is preferably lower than 10 mT, since lower pressures provide higher electron temperatures.

Preferably the hardening gas is a carrier gas with a high ionization potential. Argon, which is a common carrier gas has a first ionization potential of 15.759 eV. This gas is commonly used as a carrier gas for commercial etch applications. Therefore helium, with a first ionization potential of 24.587 eV, is a preferred carrier gas for the hardening gas over argon. Helium is not commonly used as a carrier gas for commercial etch applications. Argon may be used for the carrier gas for the etching gas, to provided lower energy electrons during the etch.

Figure 3:
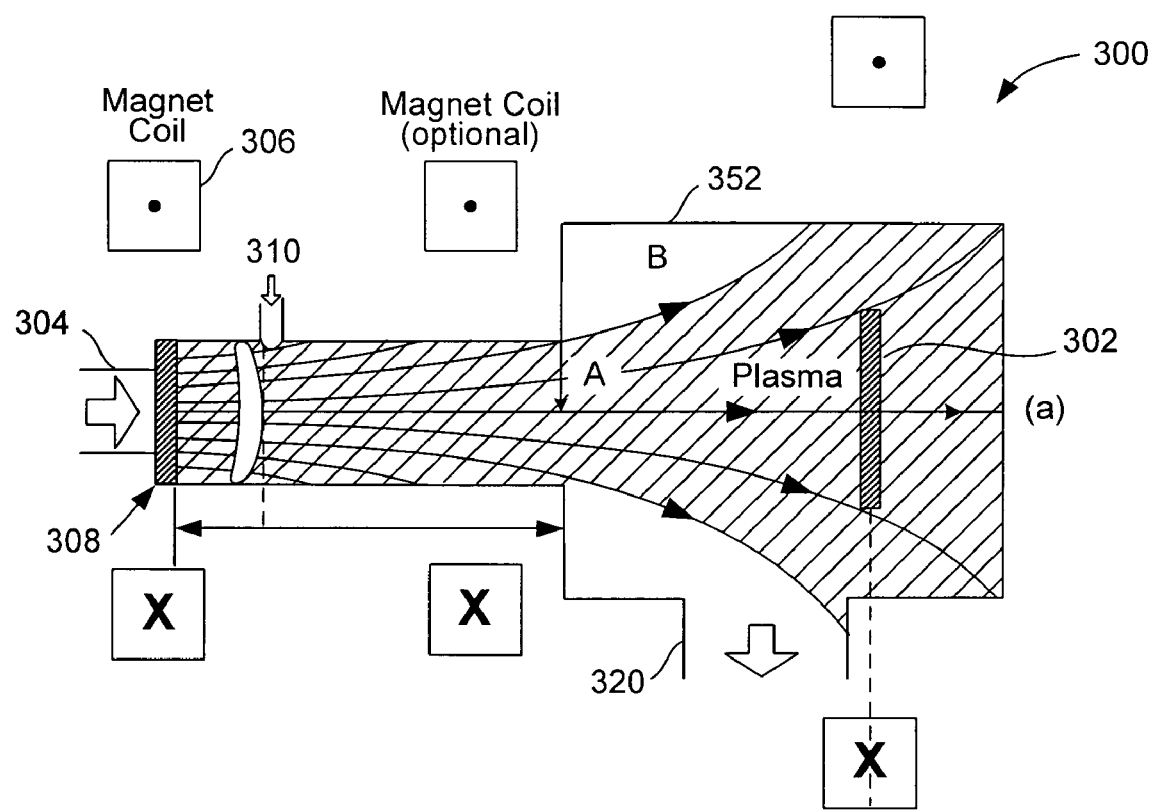
FIG. 3 is a schematic view of a processing chamber that may be used in an embodiment of the invention.

FIG. 3 is a schematic view of a plasma processing chamber 300 that may be used in a preferred embodiment of the invention. The plasma processing chamber 300 comprises a substrate support 302, a microwave power source 304, a magnetic field source 306, a window 308, a gas source 310, and an exhaust pump 320. The gas source 310 comprises a hardening gas source and an etching gas source. The gas source 310 may comprise additional gas sources, such as a photoresist stripping gas source. Within plasma processing chamber 300, a wafer is placed on the substrate support 302. Gas is supplied to the confined plasma volume by gas source 310 and is exhausted from the confined plasma volume by the exhaust pump 320. The microwave power source 304 is used to provide microwave power to the gas, which is used to provide higher populations of high energy electrons. Chamber walls 352 surround the plasma processing chamber 300.

Figure 6:
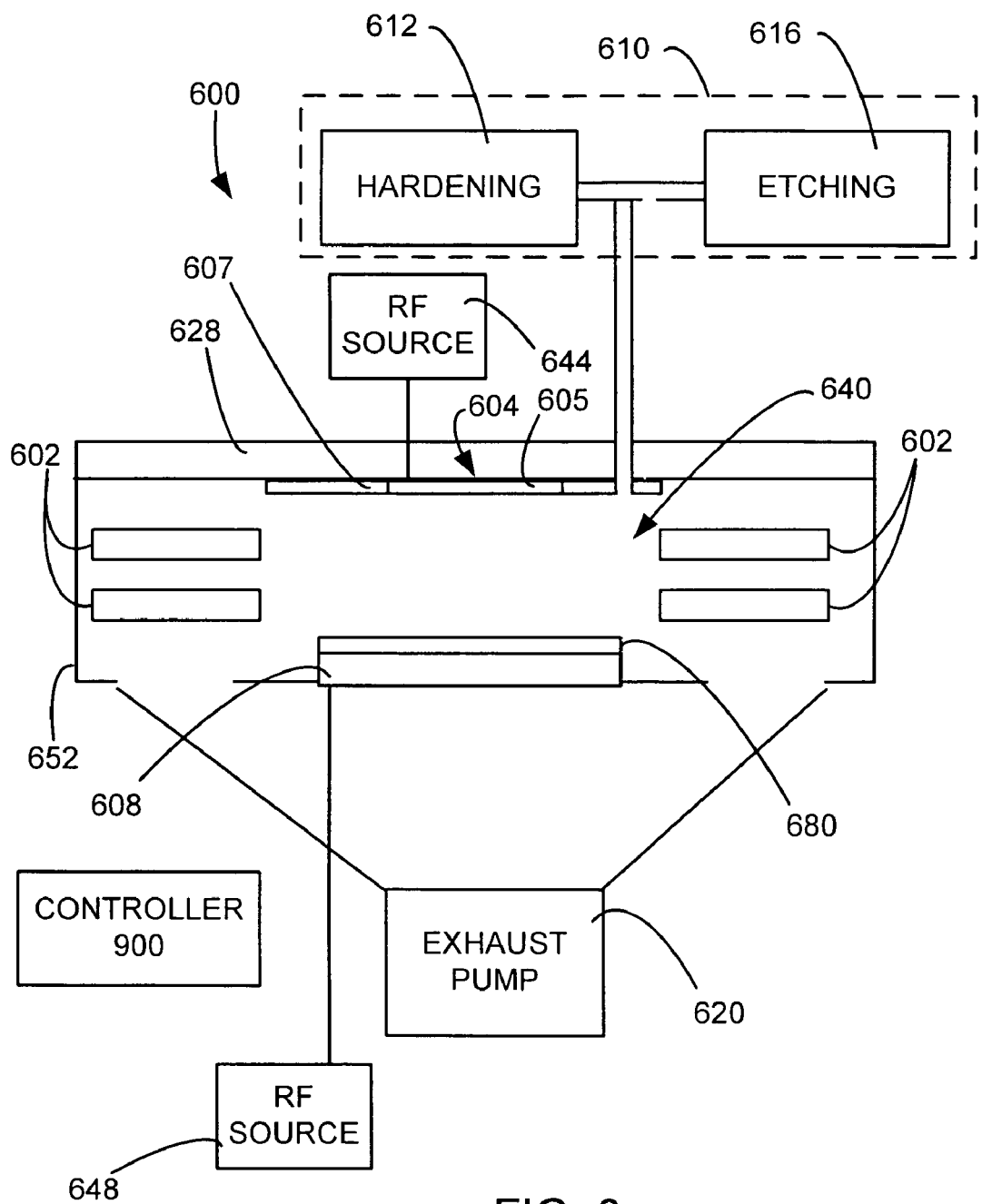
FIG. 6 is a schematic view of another processing chamber that may be used in another embodiment of the invention.

FIG. 6 is a schematic view of a plasma processing chamber 600 that may be used in another embodiment of the invention. The plasma processing chamber 600 comprises confinement rings 602, an upper electrode 604, a lower electrode 608, a gas source 610, and an exhaust pump 620. The gas source 610 comprises a hardening gas source 612 and an etching gas source 616. The hardening gas source 612 may provide helium. The etching gas source 616 may provide a carrier gas, such as argon, and an active etchant gas. The gas source 610 may comprise additional gas sources, such as a photoresist stripping gas source. Within plasma processing chamber 600, the wafer 680 is positioned upon the lower electrode 608. The lower electrode 608 incorporates a suitable substrate chucking mechanism (e.g., electrostatic, mechanical clamping, or the like) for holding the wafer 680. The reactor top 628 incorporates the upper electrode 604 disposed immediately opposite the lower electrode 608. The upper electrode 604, lower electrode 608, and confinement rings 602 define the confined plasma volume. Gas is supplied to the confined plasma volume by gas source 610 and is exhausted from the confined plasma volume through the confinement rings 602 and an exhaust port by the exhaust pump 620. A first RF source 644 is electrically connected to the upper electrode 604. A second RF source 648 is electrically connected to the lower electrode 608. Chamber walls 652 surround the confinement rings 602, the upper electrode 604, and the lower electrode 608. Both the first RF source 644 and the second RF source 648 may comprise a 27 MHz power source and a 2 MHz power source. In the alternative, the upper electrode 604 may be grounded. Different combinations of connecting RF power to the electrode are possible. In the case of Exelan-HP made by LAM Research Corporation™ of Fremont, Calif., that may be used in a preferred embodiment of the invention, both the RF sources are connected to the lower electrode, and the upper electrode is grounded. A controller 900 may be controllably connected to the gas source 610, the first and second RF power sources 644, 648, the confinement rings 602, and the exhaust pump 620, to control the separate hardening and etch steps.

The upper electrode 604 may be segmented to provide an inner upper electrode 605 and an outer upper electrode 607. The inner and outer upper electrodes may be powered in various configurations to alternately facilitate hardening and then to facilitate etching, by decreasing and then increasing the size of the upper electrode.

Figure 7:
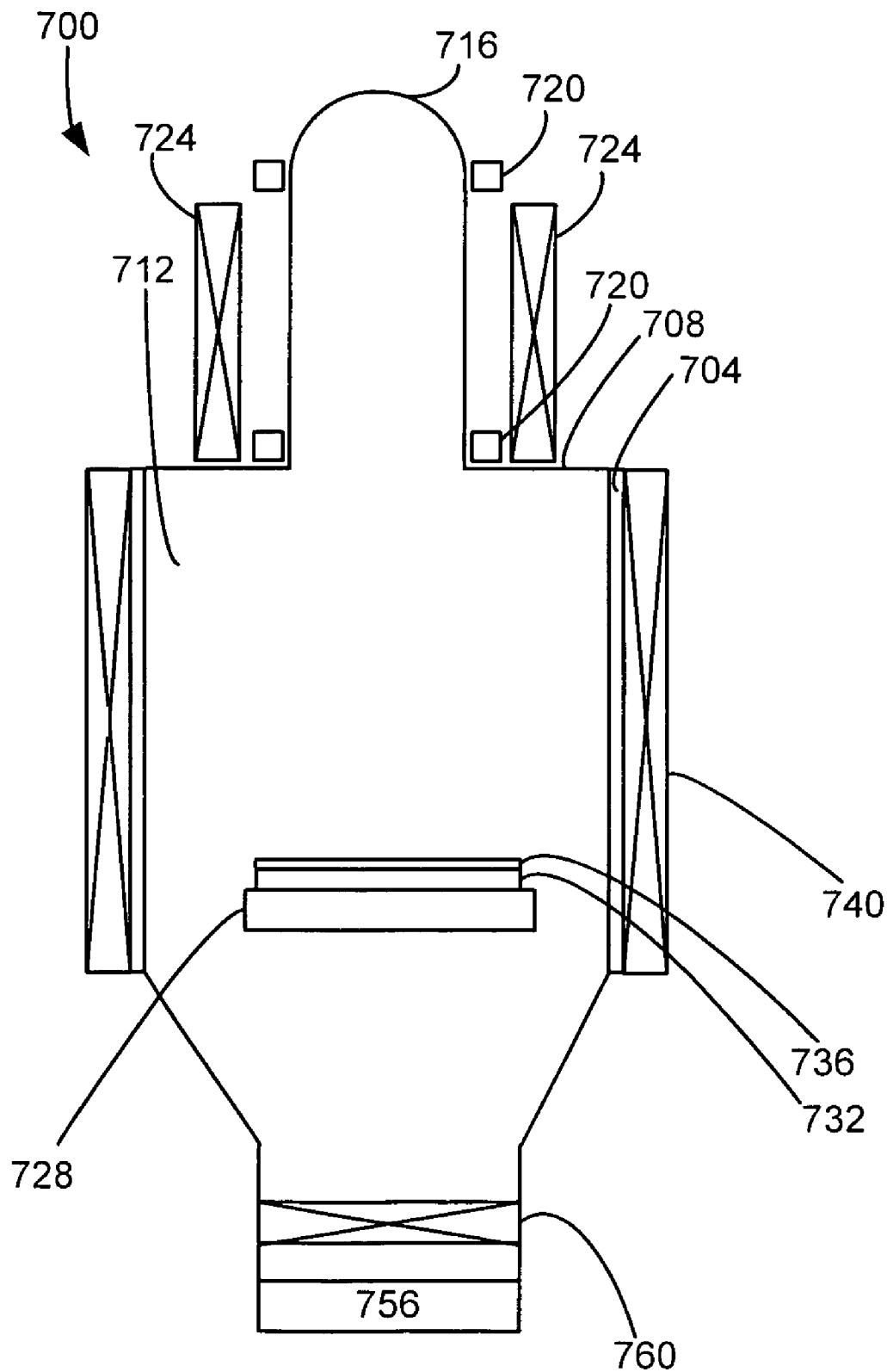
FIG. 7 is a schematic view of another processing chamber that may be used in another embodiment of the invention.

FIG. 7 is a schematic view of a reaction chamber 700, used for another embodiment of the invention. The reaction chamber in a preferred embodiment of the invention is a helicon etching system. The reaction chamber 700 comprises a chamber wall 704 and a top 708 defining a cavity 712. A wafer support 728 supports a wafer 732 with a patterned photoresist layer 736 within the cavity. A vacuum pump 756 is also coupled to the cavity 712 through a pressure control valve 760. A quartz bell jar 716 is located at the top of the chamber 700. A double loop antenna 720 surrounds an upper part of the quartz bell jar 716. The bell jar 716 and antenna 720 are surrounded by a set of coplanar electromagnet coils 724, which are used to provide a diverging axial magnetic field, which is largest in the bell jar region and decreases rapidly as the wafer is approached. Such a magnetic field strength may be from about 50 Gauss to 150 Gauss. Permanent magnets 740 along the chamber wall 704 may be used to provide a multipole magnetic bucket arrangement. An example of such a helicon is a MØIRE™ helicon source from Trikon Technologies, Inc., of the United Kingdom, which is described in the article "Characterization Of An Azimuthally Symmetric Helicon Wave High Density Plasma Source," by G. R. Tynan et al., published in the Journal of Vacuum Science & Technology A, 15(6), in November/December 1997, at pages 2885-2892 and in U.S. Pat. No. 5,421,891 to Campbell et al., issued Jun. 6, 1995, entitled "High Density Plasma Deposition And Etching Apparatus," which are incorporated by reference for all purposes.

In an alternative embodiment, an inductively coupled etching device may be used.

Accelerated Secondary Electrons Embodiment

In this embodiment one attempts to exploit the observation that common capacitively driven process plasmas typically result in ion bombardment of electrode surfaces. This bombardment can result in the production of secondary electrons. These electrons will tend to be accelerated back into the plasma to a voltage equal to the difference between the plasma potential and the potential of the electrode surface. The idea is to ground the wafer by placing the wafer on an electrode at ground potential. Then RF power is applied to an electrode above the wafer using a power regime where significant secondary electron production is expected. If the electrode spacing is less than an electron-neutral collision length, then one may expect this current of accelerated electrons to reach the wafer. Capacitive coupling of RF power to plasma can often result in large sheath voltages. Such a system could be designed to provide electrons with energies greater than 500 eV and thus accelerated secondary electrons with voltages greater that 500 eV. Short gap spacing and low pressures could be employed to insure that these accelerated electrons suffer few collisions before impacting the photoresist material to be cured.

The secondary electron emission coefficient $\gamma_{se}$ depends on the target material, the impacting ion surface conditions, surface morphology and impurities. It is known that helium ions at energies as high as 100 eV impacting on Si(100) can produce a comparatively high $\gamma_{se}$ of 0.168 (most other $\gamma_{se}$ values are below 0.03). Additional candidate materials and impact ions are given in below using previously known data.

TABLE 1

| Solid | Ion | Energy (V) | $\gamma_{se}$ |
|---|---|---|---|
| Si (100) | He⁺ | 100 | 0.168 |
| Ni (111) | He⁺ | 100 | 0.170 |
| W | He⁺ | 100 | 0.263 |
| Mo | He⁺ | 100 | 0.274 |

Figure 8:
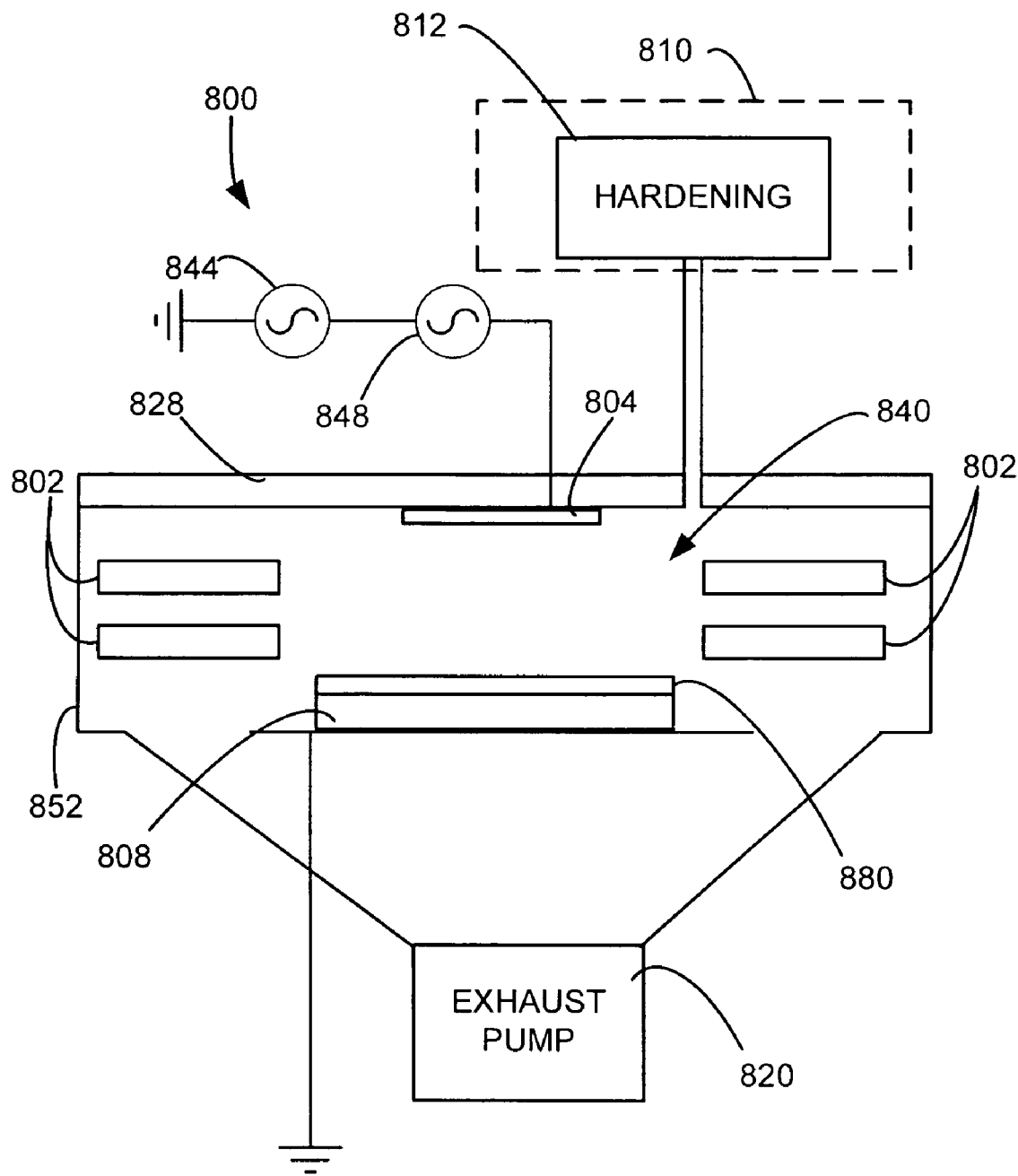
FIG. 8 is a schematic view of another processing chamber that may be used in another embodiment of the invention.

FIG. 8 is a schematic view of a processing chamber 800 that may be used in this embodiment of the invention for creating high energy secondary electrons in a plasma for hardening the photoresist. The plasma processing chamber 800 comprises confinement rings 802, an upper electrode 804, a lower electrode 808, a gas source 810, and an exhaust pump 820. The gas source 810 comprises a hardening gas source 812. The hardening gas source 812 may provide helium. Within plasma processing chamber 800, the wafer 880 is positioned upon the lower electrode 808. The reactor top 828 incorporates the upper electrode 804 disposed immediately opposite the lower electrode 808. The upper electrode 804, lower electrode 808, and confinement rings 802 define the confined plasma volume. Gas is supplied to the confined plasma volume by gas source 810 and is exhausted from the confined plasma volume through the confinement rings 802 and an exhaust port by the exhaust pump 820. A high frequency RF source 844 and a low frequency RF source 848 are electrically connected to the upper electrode 804. The lower electrode 808 is grounded. Chamber walls 852 surround the confinement rings 802, the upper electrode 804, and the lower electrode 808. The high frequency RF source 844 may comprise a 27 MHz power source. The low frequency RF source 848 may comprise a 2 MHz power source. Different combinations of connecting RF power to the electrode are possible. Preferably the high frequency RF source has a frequency that is greater than ten times the frequency of the low frequency RF power source.

Preferably the hardening gas is a carrier gas which is known to favor secondary electron emission upon collision with an electrode surface made of a given material type. In the literature, He is often reported to provide a higher secondary electron emission than Ar for a given electrode material. Therefore helium, with an ionization potential of 24.587 eV, is a preferred carrier gas for the hardening gas over argon. Argon may be used for the carrier gas for the etching gas, to provided lower energy electrons during the etch. It is believed that elements with lower atomic mass provide higher secondary electron emission.

Preferably, the upper electrode is formed from silicon, nickel, tungsten or molybdenum, since these materials provide high energy secondary electrons emission coefficients. Preferably the chuck supports the wafer so that the upper electrode is spaced opposite the wafer by a separation distance of between 100 and 0.5 cm. More preferably, the upper electrode and wafer are spaced by a separation distance of between 1 and 10.0 cm. Most preferably, the upper electrode and wafer are spaced apart by a separation distance of 1 and 3 cm.

In operation, for photoresist hardening, a hardening gas such as helium is provided by the hardening gas source 812. A plasma is generated using the high frequency power source 844 to capacitively couple with the plasma. The low frequency power source provides a bias to the upper electrode 804, which accelerates ions in the plasma to the upper electrode 804. The lower electrode, upon which the wafer is mounted has an area larger than the upper electrode. The preferable ratio is a upper to lower electrode area ratio of less than or equal to 1. It is preferred that this ratio is not appreciably less than one as eventually such a reduction will impact the uniformity of the high energy electrons over the surface of the wafer. The ions collide with the upper electrode to generate secondary electrons. These secondary electrons are then accelerated back through the sheath between the upper electrode and the plasma to make them high energy secondary electrons, which are accelerated away from the upper electrode to the substrate 880. This acceleration potential is roughly equal to the plasma potential minus the potential found at the powered upper electrode. Because the electrode on which the wafer resides has a larger area, the potential across the sheath over the wafer will be smaller. For area ratios, upper electrode area to lower electrode area (or wafer area) less than 3:4 (and more preferably 1:2) are reasonable to neglect the potential of the sheath facing the wafer on the grounded and unpowered electrode. The material forming the upper electrode critically determines the amount of secondary electrons produced. It is therefore desirable to select a material known to have a high secondary emission coefficient. The high-energy secondary electrons provide photoresist hardening. Although the confinement rings 802 are useful for providing pressure control, other embodiments may not have such confinement rings and may decrease the spacing between the upper electrode and photoresist layer. The etching may be carried out in the same chamber or in a different chamber. In other embodiments, a single RF power source may be used to both energize the plasma and bias the upper electrode to attract ions.

Figure 9A:
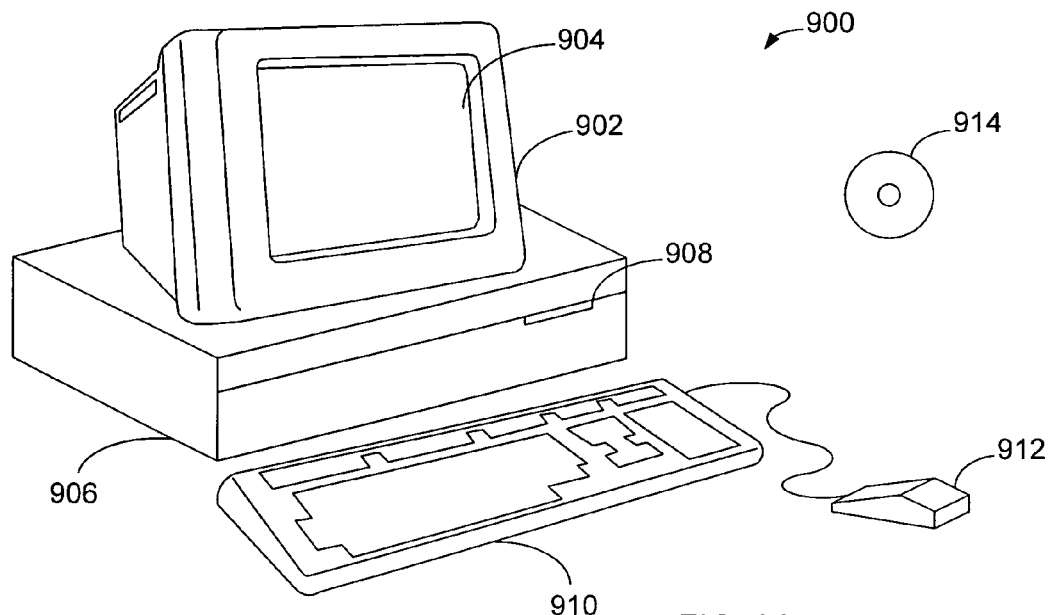
FIGS. 9A and 9B illustrate a computer system, which forms part of the network, and is suitable for providing a controller system.
Figure 9B:
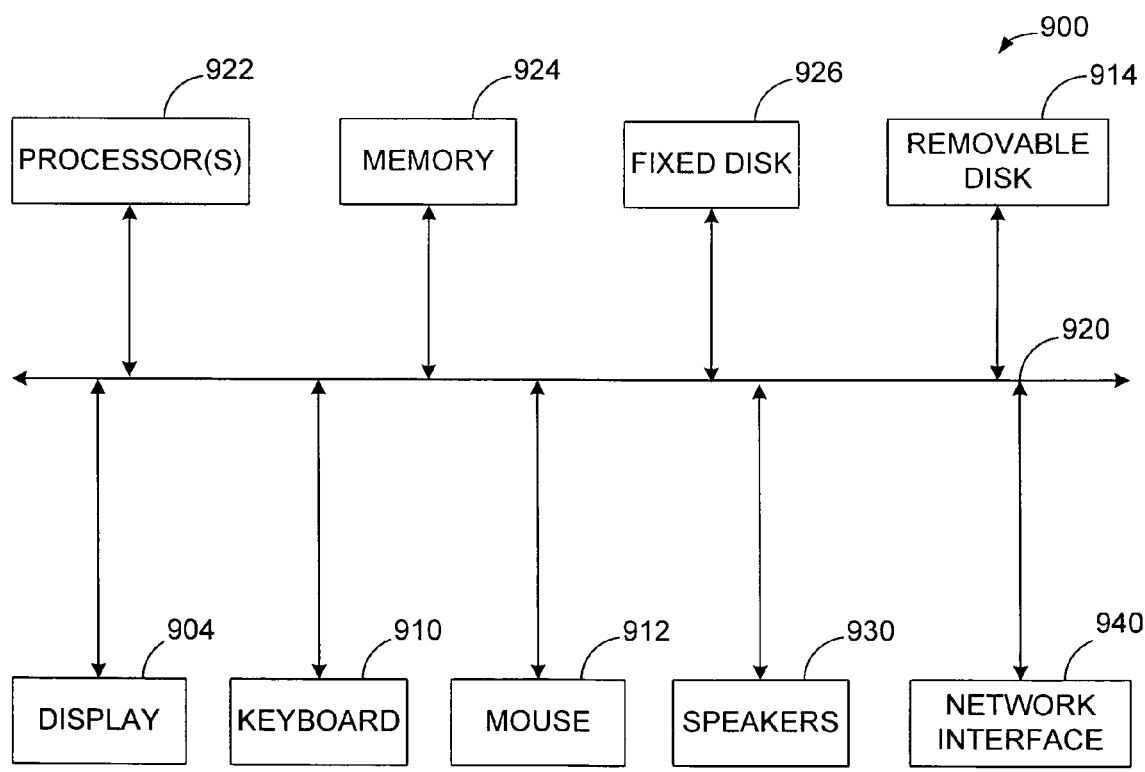

FIGS. 9A and 9B illustrate a computer system 900, which is suitable for implementing a controller used in embodiments of the present invention. FIG. 9A shows one possible physical form of the computer system. Of course, the computer system may have many physical forms ranging from an integrated circuit, a printed circuit board, and a small handheld device up to a huge super computer. Computer system 900 includes a monitor 902, a display 904, a housing 906, a disk drive 908, a keyboard 910, and a mouse 912. Disk 914 is a computer-readable medium used to transfer data to and from computer system 900.

FIG. 9B is an example of a block diagram for computer system 900. Attached to system bus 920 are a wide variety of subsystems. Processor(s) 922 (also referred to as central processing units, or CPUs) are coupled to storage devices, including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data, and the like and is typically a secondary storage medium (such as a hard disk) that is slower than primary storage. It will be appreciated that the information retained within fixed disk 926 may, in appropriate cases, be incorporated in standard fashion as virtual memory in memory 924. Removable disk 914 may take the form of any of the computer-readable media described below.

CPU 922 is also coupled to a variety of input/output devices, such as display 904, keyboard 910, mouse 912 and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described method steps. Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Any photoresist material may be used to produce the patterned photoresist layer that is to be cross-linked. Preferably, the photoresist material is photoresist material that is exposed by light that has a wavelength of less than 248 nm. Most preferably, the photoresist material is a photoresist material that is exposed by light that has a wavelength no greater than 193 nm, such as poly(MAdMA-co-MLMA) or another PMMA-based polymer.

The invention provides plasma hardening and plasma etching in a single process chamber. This allows for a smaller processing foot print and faster through put.

In a preferred embodiment of the invention the plasma hardening step is done prior to the etching step in a sequential manner. In such an embodiment the plasma hardening step is completed and terminated before the etching step is begun. In another embodiment of the invention, the plasma hardening step and the etching step are done in an alternating fashion for a plurality of cycles. In another embodiment of the invention, the plasma hardening step may be done simultaneously with the etching step.

EXAMPLES

An example of this process for a 193 nm photoresist is provided using the high density plasma embodiment. In this example, a photoresist layer of 500 nm thickness is deposited over a substrate (step 104). The 500 nm thick photoresist layer may be patterned to form features with a critical dimension of 90 nm (step 108). The wafer is then placed in an etch chamber (step 112). In this example, the etch chamber was an Exelan HP with a single zone electrostatic chuck. In this example, the etch chamber is an inductively coupled plasma chamber. A hardening gas of 100 sccm of helium was provided to the etch chamber (step 404). Pressure was maintained at about 5 mT. 3 kW of rf power was applied to TCP coils to generate a plasma from the hardening gas (step 408). A zero bias power was provided. An electrostatic chuck temperature of about 20° C. was maintained, to keep the wafer at about 20° C. The photoresist was exposed to the hardening plasma for about 500 seconds to complete the resist hardening (step 412). The flow of the hardening gas was then stopped (step 416). It is believed that the above example creates 0.5 keV to 4 keV electrons that penetrate and harden the photoresist to a depth of about 150 to 250 nm. Etching with a plasma with a lower energy electron tail may then be used to provide selective etching with reduced photoresist etching and damage (step 120) using an active etchant gas. An example of an etch recipe would use a pressure of 55 mT, with 800 W at 27 MHz, 1400 W at 2 MHz, with an electrostatic chuck temperature of −15° C., and an etchant gas flow of 100 sccm argon, 200 sccm carbon monoxide, 20 sccm $C_4F_6$, sccm $O_2$, and 15 sccm $CH_2F_2$ for 15 seconds. The above plasma hardening step provided a hardened photoresist which exhibited greater etch resistance.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. An apparatus for creating semiconductor devices by etching a layer over a wafer, comprising:
    a process chamber;
    a hardening gas source;
    an etching gas source; and
    a controller controllably connected to the hardening gas source and the etching gas source, comprising computer readable media, comprising:
        computer instructions for hardening the photoresist by providing a hardening plasma containing high energy electrons in the process chamber to harden the photoresist layer, wherein the high energy electrons have a density, wherein the high energy electrons have an energy greater than 450 eV, wherein the density of the high energy electrons in the hardening plasma is greater than $10^8$ electrons/cm$^3$; and
        computer instructions for etching the wafer within the process chamber with an etching plasma, where a density of high energy electrons in the etching plasma is less than the density of high energy electrons in the hardening plasma,
        wherein the computer instructions for hardening the photoresist comprises:
            computer instructions for accelerating ions from the hardening plasma to an electrode to generate secondary electrons;
            computer instructions for accelerating the secondary electrons back through a plasma sheath to the wafer;
            computer instructions for exposing the photoresist to the accelerated secondary electrons; and
            computer instructions for terminating the hardening the photoresist prior to etching the wafer.

2. The apparatus, as recited in claim 1, wherein the electrode is formed by a material selected from the group consisting of nickel, tungsten, and molybdenum.

3. The apparatus, as recited in claim 1, wherein the electrode is formed by a material of nickel.

4. The apparatus, as recited in claim 1, wherein the electrode is formed by a material of tungsten.

5. The apparatus, as recited in claim 1, wherein the electrode is formed by a material of molybdenum.

6. The apparatus, as recited in claim 1, wherein the electrode has a diameter and the wafer has a diameter, wherein the electrode has a smaller diameter than the wafer.

7. The apparatus, as recited in claim 6, further comprising a wafer support, for supporting the wafer in the process chamber, wherein the wafer support is spaced apart from the electrode, so that the electrode is separated from the wafer by a distance of between 0.5 and 100 cm, and wherein the hardening gas source comprises a helium gas source.

8. The apparatus, as recited in claim 1, further comprising a first frequency RF power source connected so as to power the electrode.

9. The apparatus, as recited in claim 8, further comprising a second frequency RF power source electrically connected to the electrode, wherein the first frequency is at least ten times greater than the second frequency.

* * * * *